United States Patent
Hiroshima

(10) Patent No.: US 6,911,359 B2
(45) Date of Patent: Jun. 28, 2005

(54) METHOD FOR MANUFACTURING A SEMICONDUCTOR DEVICE, SEMICONDUCTOR DEVICE, DISPLAY DEVICE, AND ELECTRONIC DEVICE

(75) Inventor: Yasushi Hiroshima, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/329,699

(22) Filed: Dec. 27, 2002

(65) Prior Publication Data

US 2003/0160263 A1 Aug. 28, 2003

(30) Foreign Application Priority Data

Dec. 28, 2001 (JP) .................................. 2001-400422

(51) Int. Cl.$^7$ ............................................. H01L 21/00
(52) U.S. Cl. ....................................... 438/166; 438/149
(58) Field of Search ................................ 438/166, 149

(56) References Cited

U.S. PATENT DOCUMENTS

| | | | |
|---|---|---|---|
| 5,893,730 A | 4/1999 | Yamazaki et al. | |
| 6,133,073 A | 10/2000 | Yamazaki et al. | |
| 6,291,275 B1 * | 9/2001 | Yamazaki et al. | .......... 438/151 |

FOREIGN PATENT DOCUMENTS

JP        A 62-119914      6/1987

OTHER PUBLICATIONS

IBM TDB ppp 257–258, 1993.*
"Single Crystal Thin Film Transistors", IBM Technical Disclosure Bulletin, pp. 257–258, 1993.
Ishihara et al., "Advance Excimer–Laser Crystallization Techniques of Si Thin–Film for Location Control of Large Grain on Glass", Proceedings of SPIE, vol. 4295, pp. 14–23, 2001.

* cited by examiner

Primary Examiner—Douglas Wille
(74) Attorney, Agent, or Firm—Oliff & Berridge, PLC

(57) ABSTRACT

An insulating film (12) is formed on a substrate (11), and an aperture (121) is formed in the prescribed position on the surface of the insulating film (12) perpendicular to such surface, and an amorphous silicon film (13) having a prescribed thickness is formed on the insulating film (12). Subsequently, the amorphous silicon film (13) is changed to a polycrystalline silicon film (13) by a solid-phase growth through a heat treatment. The polycrystalline silicon film (13) is irradiated by a laser under a prescribed condition, and the polycrystalline silicon inside the bottom part of the aperture (121) is maintained in an unmelted state while other parts of the polycrystalline silicon film are completely melted, so that the unmelted polycrystalline silicon can be used as a crystal nucleus for crystal growth, and the area around the aperture (121) in the polycrystalline silicon film is changed to a silicon film in a substantially single crystal state. Using such silicon film in a substantially single crystal state, a thin-film transistor is obtained.

10 Claims, 6 Drawing Sheets

METHOD FOR MANUFACTURING A SEMICONDUCTOR DEVICE, SEMICONDUCTOR DEVICE, DISPLAY DEVICE, AND ELECTRONIC DEVICE

BACKGROUND OF THE INVENTION

1. Field of the Invention

The present invention relates to a method for manufacturing a semiconductor device, and a semiconductor device that is obtained using such method, and a display device and an electronic device that includes such semiconductor device. More particularly, the present invention relates to a manufacturing method, wherein an aperture is formed in an insulating film provided on a substrate, and an amorphous silicon film is formed on such insulating film, and the amorphous silicon film is irradiated by a laser, so that a silicon film in a substantially single crystal state is formed in the position of the aperture, and a semiconductor device using such silicon film as a semiconductor film is produced.

2. Related Art

Conventionally, the method explained below has been used in the manufacture of a thin-film semiconductor device, typically a thin-film polycrystalline silicon transistor (p-Si TFT), in a low temperature condition, for example, at 600° C. or lower, that is, a temperature that permits the use of a general glass as a substrate, or at 425° C. or lower, that is, the same level of temperature as that at the time of the manufacture of an amorphous silicon thin-film transistor (a-Si TFT).

According to the forementioned method, a silicon dioxide film, which functions as an insulating film, is first deposited on the glass substrate as a base protecting film, and an amorphous silicon film, which will become a semiconductor film, is deposited on such silicon dioxide film. Subsequently, the amorphous silicon film is irradiated by an XeCl pulsed excimer laser beam (wavelength of 308 nm), thereby changing the amorphous silicon film into a polycrystalline silicon film (laser heat treatment process). In this laser heat treatment process, the amorphous silicon film absorbs the laser beam and is melted as its temperature rises, and the melted silicon film is crystallized as the temperature subsequently drops, and a polycrystalline silicon film is thus prepared.

After the laser heat treatment process, a silicon dioxide film, which will become a gate insulating film, is formed by the chemical vapor deposition method (CVD) or the physical vapor deposition method (PVD). Subsequently, a gate electrode made of tantalum or the like is formed, and a field effect transistor (MOS-FET) having a structure comprised of metal (gate electrode)—oxide film (gate insulating film)—semiconductor (polycrystalline silicon film) is obtained. Interlaying insulating films are deposited on these films, and after contact holes are formed, electrodes are wired using the thin metal film. Thus, a thin-film semiconductor device is completed.

However, according to such a method for manufacturing a thin-film semiconductor device, the energy density of the excimer laser beam is difficult to control, such that the energy density changes at the time of the laser heat treatment and results in wide variances of semiconductor film properties. These variances in the semiconductor film properties are particularly apparent around the laser irradiation states (irradiation energy densities) that enable the production of a relatively preferable polycrystalline semiconductor film. Therefore, in the actual manufacturing process, the energy density is set slightly lower than the optimum value in order to reduce the influence of such variances in the semiconductor film properties. However, by doing so, the energy density becomes insufficient, and the production of a preferable polycrystalline thin film becomes difficult.

Furthermore, even if a laser is irradiated with the optimum irradiation energy density that enables the production of a relatively preferable polycrystalline film, the silicon film is obtained in a polycrystalline state, and the grain boundaries of the polycrystal make the properties of the thin-film semiconductor device inferior to those made of single crystal silicon. Moreover, because the areas where the grain boundaries generate cannot be controlled, the properties of the thin-film semiconductor device formed on such polycrystalline silicon film widely vary in many cases, even in the same substrate.

The methods according to the "Single Crystal Thin Film Transistors," IBM Technical Disclosure Bulletin, August 1993, pp 257–258, and the "Advanced Excimer-Laser Crystallization Techniques of Si Thin-Film For Location Control of Large Grain on Glass," R. Ishihara et al., proc. SPIE 2001, vol. 4295, pp 14–23, intend to solve such drawbacks. These documents suggest a technology that includes the steps of: forming an aperture in an insulating film provided on a substrate; forming a silicon film on such insulating film; irradiating the silicon film with a laser beam under a prescribed condition; maintaining the silicon inside the bottom part of the aperture in an unmelted state while melting other parts of the amorphous silicon film; generating crystal growth using the unmelted silicon as a crystal nucleus; and changing the area around the aperture on the surface of the silicon film into a silicon film in a substantially single crystal state. A similar technology is also disclosed in Patent Laid-Open Publication No. SHO 62-119914.

According to the methods disclosed in these related art documents, the cross section of the aperture must be made sufficiently small to prevent the generation of a plurality of crystalline nuclei at the bottom part of the aperture. Therefore, an expensive and precise exposure device and etching device must be used to form the aperture. However, when a plurality of thin-film transistors are formed on a large glass substrate, such as a large liquid crystal display, it becomes difficult to form the aperture using these devices. The present invention intends to solve such drawbacks of the related art, and aims to provide a method that does not require the use of an expensive and precise exposure device or etching device to form the aperture in the insulating film.

SUMMARY OF THE INVENTION

In order to solve the problems explained above, the method for manufacturing a semiconductor device according to the present invention includes the steps of: forming an insulating film on a substrate; forming an aperture that extends substantially perpendicular to a prescribed position on the surface of the insulating film; forming an amorphous silicon film with a prescribed thickness on the insulating film; changing the amorphous silicon film into a polycrystalline silicon film by a solid-phase growth through a heat treatment; irradiating the polycrystalline silicon film with a laser beam under a prescribed condition, and maintaining the polycrystalline silicon inside the aperture in an unmelted state, while melting other parts of the polycrystalline silicon film, generating crystal growth using the unmelted polycrystalline silicon inside the aperture as a crystal nucleus, and forming a silicon film in a substantially single crystal state in an area around the aperture in the polycrystalline silicon film, and producing a semiconductor device having the silicon film in the substantially single crystal state as a semiconductor film.

The phrase "in a substantially single crystal state" means a state of being made of a single crystal, or other similar states.

The semiconductor device formed by the above method has a substrate, an insulating film formed on the substrate, and a semiconductor film formed on the insulating film. The insulating film has an aperture that is formed in a prescribed position, and a semiconductor film that includes, inside a polycrystalline silicon film, a silicon film in a substantially single crystal state, which has undergone a crystal growth using the crystallized silicon film inside the aperture on the insulating film as a crystal nucleus.

A more preferable embodiment of the present invention provides a semiconductor device wherein an area of the silicon film in the substantially single crystal state, not including an aperture, is used as a semiconductor film.

Here, the cross section of the aperture preferably has the same or a smaller grain diameter in comparison to the grain diameter of a polycrystal generated by a solid-phase growth through a heat treatment. This is because, if the diameter of the aperture is the same as or similar to the grain diameter of the polycrystal, preferable growth of the crystal in the substantially single crystal state can be expected. Thus, there is no need to make the diameter of the aperture small to prevent the generation of a plurality of crystals, nor to use an expensive and precise exposure device or etching device to form the small diameter of the aperture, as suggested in the related art technical documents.

More preferably, the insulating film has a multilayered structure that includes a silicon dioxide film and a silicon nitride film, and within such multilayered structure, a silicon dioxide film is provided on the side on which an amorphous silicon film is formed.

According to such method for manufacturing a semiconductor device, the semiconductor device has, for example, a thin-film transistor structure, and an aperture that is provided at a position corresponding to the position where such thin-film transistor is formed.

The present invention pertains to a display device that includes a semiconductor device having the aforementioned structure as a thin-film transistor, and electronic device that includes such display device.

There is no limitation to the "display device" mentioned here, and such display device has, for example, a liquid crystal display element capable of driving a liquid crystal layer, or an electroluminescense device capable of driving an electroluminescense layer using an active matrix driving method.

There is no limitation to the "electronic device" mentioned here, and such electronic device has a display device comprised of an electroluminescense device, for example, portable phones, video cameras, personal computers, head mount displays, rear or front type projectors, facsimile devices having display functions, digital camera finders, portable TVs, DSP devices, PDAs, and electronic notebooks.

DETAILED DESCRIPTION OF THE PREFERRED EMBODIMENTS

Figure 1:
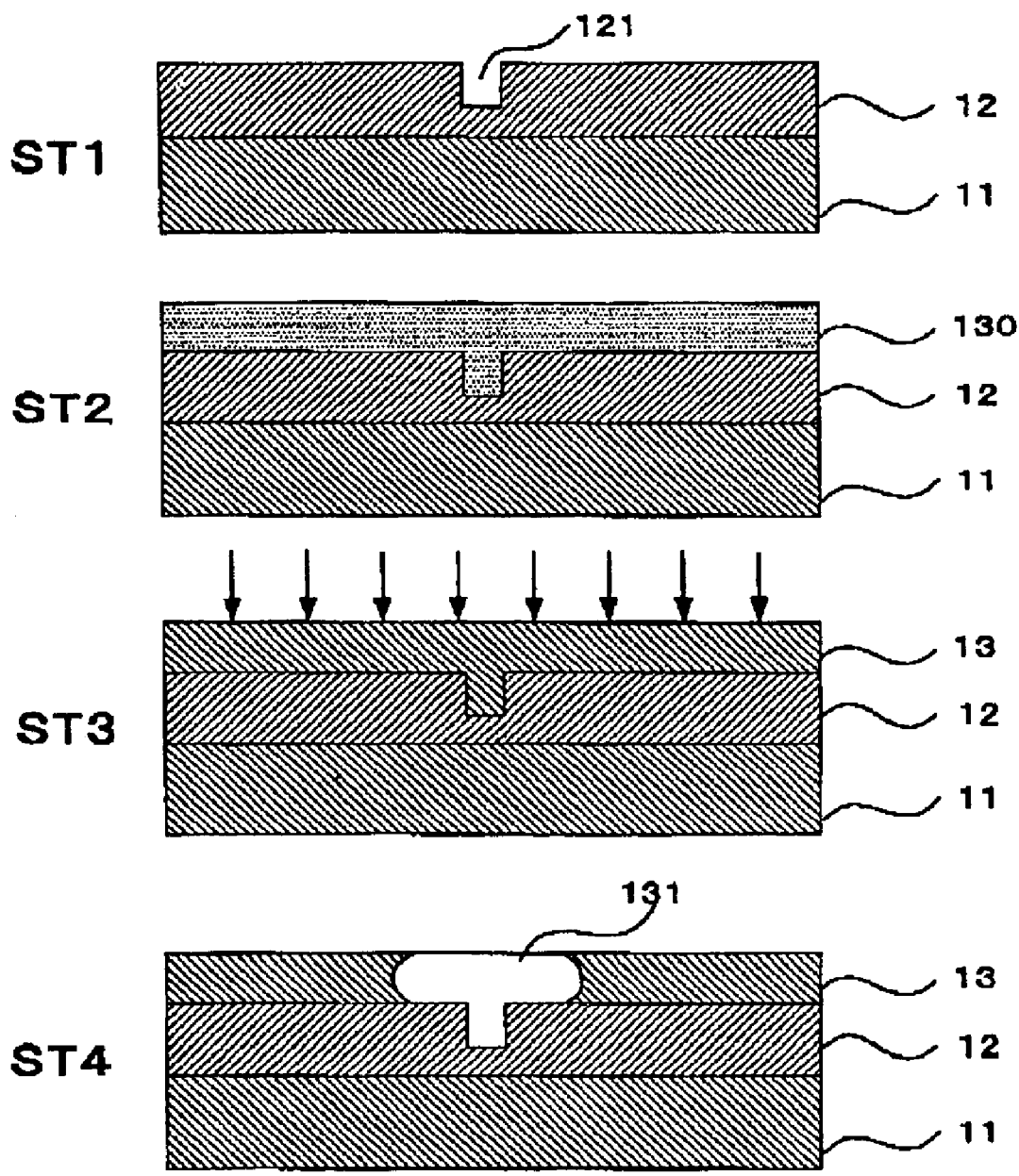
FIG. 1 is a diagram illustrating Embodiment 1 of the present invention, more specifically, a cross-sectional manufacturing process diagram illustrating the steps up to the melting stage.

The embodiments of the present invention will be explained below in reference to the drawings.

Embodiment 1

Embodiment 1 will be explained according to FIG. 1.

Insulating Film Forming Step (Step 1)

A silicon dioxide film is deposited on a glass substrate 11 and an insulating film 12 is formed. In order to form the silicon dioxide film on a glass substrate, well known methods, for example, the plasma enhanced chemical vapor deposition method (PECVD method), the low pressure chemical vapor deposition method (LPCVD method), the sputtering method and other vapor deposition methods can be used. For example, by using the PECVD method, a silicon dioxide film 12 having a thickness of 1 $\mu$m can be formed.

Aperture Forming Step (Step 1)

Through the photolithography process and the etching process, an aperture having a prescribed diameter, for example, an aperture 121 in a substantially round shape, having a cross section diameter of 0.5 $\mu$m, is formed in a prescribed position on the surface of the silicon dioxide film 12. The method of etching may be, for example, the reactive ion etching method that uses the plasmas of $CF_4$ and $H_2$ gases. In such a case, the cross section of the aperture 121 is made preferably the same size or slightly smaller than the crystal grains that are generated or grown through a heat treatment of the amorphous silicon film 130. The inside of the aperture 121 is covered with a single crystal grain for preferable crystal growth in the subsequent heat treatment.

Amorphous Silicon Film Forming Step (Step 2)

Using a prescribed method, for example, the LPCVD method, an amorphous silicon film is deposited on the silicon dioxide film 12 and inside the aperture 121. Through such process, an amorphous silicon film 130 having a thickness of, for example, 50 nm to 500 nm, is formed on the silicon dioxide film 12. In order to easily and securely deposit a highly pure silicon film inside the aperture 121, the amorphous silicon film 130 is formed preferably by the LPCVD method or the like.

Polycrystalline Silicon Film Forming Step (Step 3)

The heat treatment is conducted and the amorphous silicon film 130 is polycrystallized through the solid-phase growth and changed into a polycrystalline silicon film 13. For example, the heat treatment is conducted for 24 to 48 hours at 600° C. in a nitrogen condition. Through the heat treatment, the amorphous silicon undergoes a solid-phase growth, and the crystal grains in the film grow to a prescribed size, for example, approximately 0.5 μm to 2 μm. Similar crystal growth occurs in the amorphous silicon inside the aperture 121.

Melting Step (Step 4)

As illustrated in Step 4 of FIG. 1, high energy is applied to the polycrystalline silicon film 13, thereby melting the film. A laser beam, for example, is irradiated as an energy source. More specifically, the XeCl pulsed excimer laser beam (wavelength of 308 nm and pulse width of 30 nsec), for example, is used, and the laser irradiation is performed with the energy density of about 0.4 J/cm$^2$ to 1.5 J/cm$^2$ (arranged for the polycrystalline silicon film 13 having a thickness of 50 nm to 500 nm). Consequently, the polycrystalline silicon film 13 at the bottom part of the aperture 121 in the silicon dioxide film 12 is maintained in an unmelted state, while other parts of the polycrystalline silicon film 13 are almost completely melted.

The laser irradiation is preferably used as a method to apply energy. This is because, under the wavelength of the XeCl pulsed excimer laser beam (308 nm), the amorphous silicon and crystalline silicon demonstrate high absorption coefficients (0.139 nm$^{-1}$ and 0.149 nm$^{-1}$ respectively), and most of the irradiated XeCl pulsed excimer laser beam is absorbed near the surface of the polycrystalline silicon film 13.

After the laser irradiation, crystal growth occurs from the unmelted crystal nucleus at the bottom part of the aperture 121 in the dioxide film 12. In this embodiment, the cross section of the aperture is made the same size or slightly smaller than the grain diameter of a polycrystal generated by the solid-phase growth of the amorphous silicon film 13 through heat treatment, so that the aperture 121 is covered with a single-crystal grain. Upon the solidification of the silicon after the laser irradiation, the single crystal grain becomes the nucleus for the crystal growth. Consequently, as shown in Step 4 of FIG. 1, an area around the aperture 121 on the surface of the polycrystalline silicon film 13 is changed to a silicon film 131, which is in a substantially single crystal state.

Using this method, a large crystal grain having a prescribed diameter, for example, about 4 μm, can be formed around the aperture 121. Furthermore, if the temperature of the agent is set to a lower temperature at the time of the laser heat treatment process, for example, to about 400° C., a larger crystal grain of about 6 μm can also be obtained.

The silicon film 131 in a substantially single crystal state contains few defects inside, and this results in the advantage of a semiconductor electricity property, in which the trap level density near the center of the forbidden band in the energy band diagram is smaller. Furthermore, the silicon film 131 in a substantially single crystal state has no crystal grain boundary, and this results in the advantage of electrons and holes, which are the obstacles to the flow of carriers, being greatly reduced. A thin-film transistor that includes the silicon film 131 as an active layer (source and drain region and channel forming region) is a preferable transistor having favorable properties, namely, a small off-state current value and high mobility.

Figure 2:
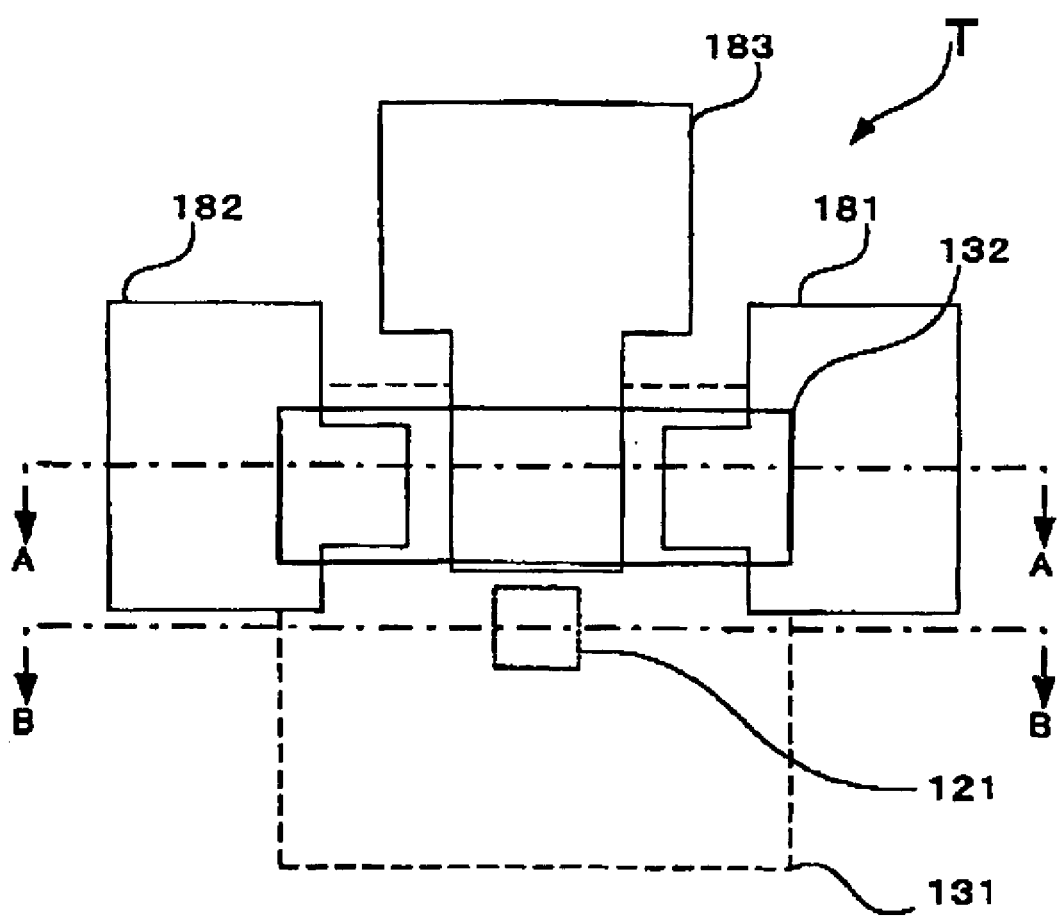
FIG. 2 is a plan view illustrating a thin-film transistor formed according to Embodiment 1 of the present invention.
Figure 3:
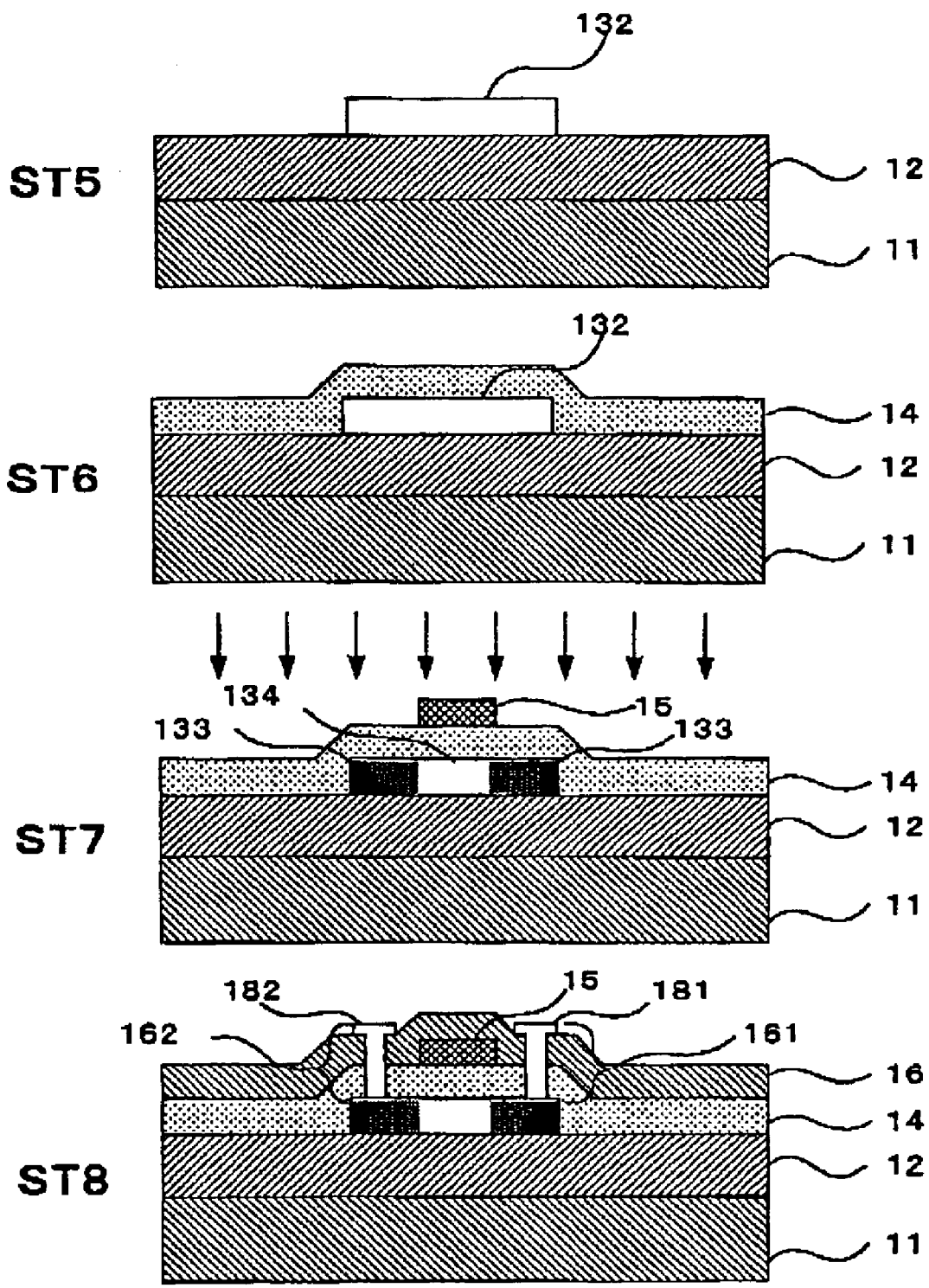
FIG. 3 is a diagram illustrating Embodiment 1 of the present invention, more specifically, a cross-sectional manufacturing process diagram illustrating the method for manufacturing a thin-film transistor, which constitutes a step for manufacturing a semiconductor device.

Semiconductor Device Forming Steps (FIGS. 2 and 3)

The method for manufacturing a thin-film transistor will be explained in reference to FIGS. 2 and 3. FIG. 2 is a outlined plan view illustrating the thin-film transistor T, that is, the semiconductor device according to this embodiment. FIG. 3 is a cross-sectional manufacturing process diagram of the thin-film transistor T, and steps 5 through 8 explained below pertain to the cross section of the thin-film transistor T taken along cross-sectional line A—A in FIG. 2. Steps 1 through 4 in FIG. 1 explained above are illustrated in the cross-sectional manufacturing process diagram pertaining to the cross section of the thin-film transistor T taken along line B—B in FIG. 2.

In Step 5 of FIG. 3, patterning of the silicon film that includes the silicon film 131 in a substantially single crystal state is conducted, and a semiconductor region (semiconductor film) 132 for the thin-film transistor T is formed. For example, within the silicon film 132 in a substantially single crystal state, an area not including the aperture 121 is allocated to the channel forming region 134 of the thin-film transistor T.

In Step 6 of FIG. 3, a silicon dioxide film 14 is formed on the silicon dioxide film 12 and the semiconductor region 132 using a prescribed manufacturing method, such as the electronic cyclotron resonance PECVD (ECR-CVD), the parallel plate PECVD, or the LPCVD. The silicon dioxide film 14 functions as a gate insulating film in the thin-film transistor.

In Step 7 of FIG. 3, a thin metal film, which is made of a prescribed metal for gates, for example, tantalum or aluminum, is formed by the sputtering method, and patterning of the metal film is conducted, and a gate electrode 15 is formed.

The gate electrode 15 is then used as a mask upon the implantation of impurity ions that will become donors or acceptors, and the source and drain region 133 and the channel forming region 134 are produced in a self-aligned manner with respect to the gate electrode 15. For example, in order to produce an NMOS transistor, phosphorus (P) having a prescribed density, for example, a density of $1 \times 10^{16}$ cm$^{-2}$, is injected into the source and drain region as an impure element.

The impure element is then activated by appropriately applying energy, for example, by irradiating an XeCl excimer laser with an irradiation energy density of about 200 to 400 m J/cm$^2$, or conducting heat treatment at about 250° C. to 450° C.

In Step 8 of FIG. 3, a silicon dioxide film 16 with a thickness of about 500 nm is formed on the silicon dioxide film 14 and the gate electrode 15 by a prescribed method, for example, the PECVD.

Contact holes 161 and 162 extending to the source and drain region 133 are then formed in the silicon dioxide films 14 and 16. Aluminum or the like is deposited inside, and around the peripheries of, these contact holes in the silicon dioxide film 16 using a prescribed method, for example, the sputtering method, forming the source and drain electrodes 181 and 182. Similarly, a contact hole (not shown in the drawings) extending to the gate electrode 15 is provided in the silicon dioxide film 16, forming a terminal electrode 183 (See FIG. 2) for the gate electrode 15. Consequently, a thin-film transistor T is obtained.

Because the obtained thin-film transistor includes a silicon film in a substantially single crystal state as a semiconductor film, an area in the crystal grain that contains very little or few grain boundaries or defects, which become a major obstacle to the carrier flow, can be used as a channel forming region.

Furthermore, according to the method of this embodiment, the crystal grain in the amorphous silicon film 130 inside the aperture 121 in the silicon dioxide film 12 changes into a large size by the solid-phase growth through the heat treatment. Therefore, the diameter of the aperture 121 can be relatively large, for example, between 0.5 μm and 2 μm. Consequently, unlike the methods suggested in the related art documents, an expensive and precise exposure device or etching device need not be used to form the single crystal. Therefore, favorable properties are steadily obtained even in the case where many thin-film transistors are formed on a large glass substrate having a radius of, for example, 300 mm or larger.

In addition, at the periphery of the aperture 121 on the surface of the silicon film in the substantially single crystal state 131, the direction of single crystal growth in the upper part of the aperture 121 changes from an upward direction to a horizontal direction, such that deformations and defects are expected. However, an area on the surface of the silicon film 131 in a substantially single crystal state, which does not include the aperture 121, can be used as the channel forming region. By doing so, a thin-film transistor T can be formed, avoiding the parts susceptible to deformations and defects. As a result, the method of this embodiment provides the transistor T having particularly favorable properties, namely, a smaller off-state current, sharper subliminal properties (smaller sub threshold swing values), and higher mobility, compared to the case where an area on the surface of the silicon film 131 in a substantially single crystal state, which includes the aperture 121, is used as the channel forming region 134.

Moreover, this embodiment utilizes the melting and solidification phenomena of silicon upon laser irradiation, and therefore, a silicon film in a substantially single crystal state is obtained in fewer steps and in a shorter time, compared to the technologies suggested by the aforementioned related art documents.

Embodiment 2

Figure 4:
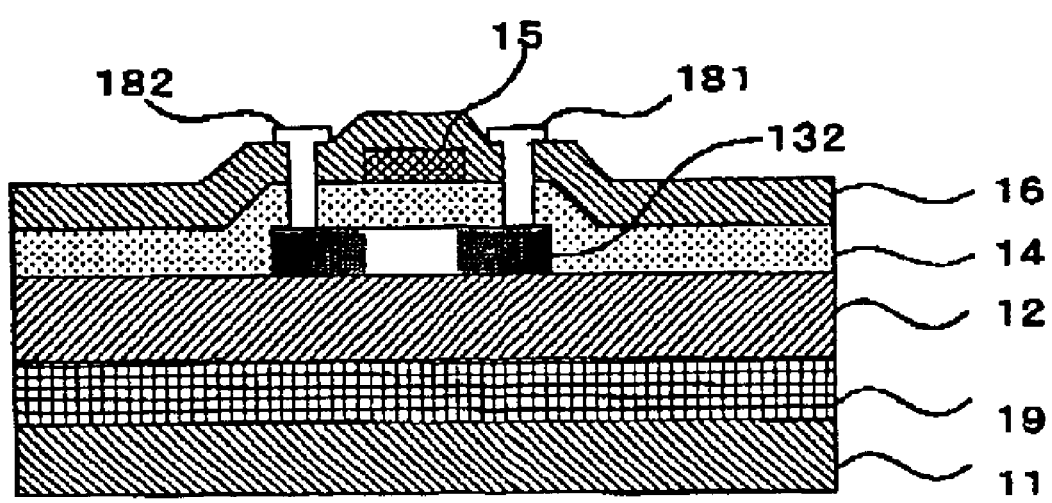
FIG. 4 is a cross-sectional diagram illustrating the thin-film transistor formed according to Embodiment 2.

FIG. 4 is a cross-sectional diagram illustrating a thin-film transistor that is prepared by the method of this embodiment. According to the method of Embodiment 2, instead of forming the silicon dioxide film 12 on the glass substrate 11 as shown in Step 1 of FIG. 1 pertaining to the method of Embodiment 1, a silicon nitride film 19 is first formed on the glass substrate 11, and the silicon dioxide film 12 is then formed on the silicon nitride film 19, and an amorphous silicon film 130 is further formed on the silicon dioxide film 12.

Other than these points, the thin-film transistor is manufactured by the same method as in Embodiment 1. Therefore, further explanations will be omitted. The thickness of the silicon nitride film 19 is, for example, 50 nm and the thickness of the silicon dioxide film 12 is, for example, 1 $\mu$m.

According to the method of Embodiment 2, the insulating film immediately above the insulating film substrate 11 has a two-layered structure consisting of the silicon nitride film 19 and the silicon dioxide film 12. Therefore, during the heat treatment, the insulating film blocks the generated heat from the substrate more effectively than in the semiconductor device manufactured according to Embodiment 1, such that an effect of highly reducing the heat damage is obtained. Furthermore, even if the substrate includes sodium, aluminum, boron or other impurities that are unfavorable to the semiconductor film, the two-layered structure of the insulating layer on the substrate effectively prevents the diffusion of these impurities from the substrate to the semiconductor film.

In addition, although the substrate is susceptible to heat damage when the laser heat treatment is conducted to melt the polycrystalline silicon film, in the present embodiment, the two-layered structure of the insulating layer on the substrate reduces the adverse effect on the substrate caused by the heat. Therefore, the manufacturing method of this embodiment has the effect of reducing heat damage, as well as the effect of preventing the diffusion of impurities, and thus a thin-film transistor with favorable properties is provided.

Moreover, according to the method of the present invention, a flat surface on the insulating film is desirable and the generation of a crystal nucleus in the melted amorphous silicon film is prevented to promote the crystal growth of the preferable silicon formed on the insulating film. A silicon dioxide film has a better surface flatness compared to a silicon nitride film. Therefore, in this embodiment, a silicon dioxide film having a favorable surface flatness is formed on the side on which the amorphous silicon film is formed, and a silicon nitride film is provided between the insulating film and the substrate.

Although the insulating layer on the substrate in this embodiment has a two-layered structure, an insulating layer with more layers can be formed. If an insulating layer with more layers is formed, the adverse effect of the heat on the substrate is further reduced.

Embodiment 3

Embodiment 3 pertains to a display device that uses a semiconductor manufactured according to the above embodiment and an electronic device having such display device.

Figure 5:
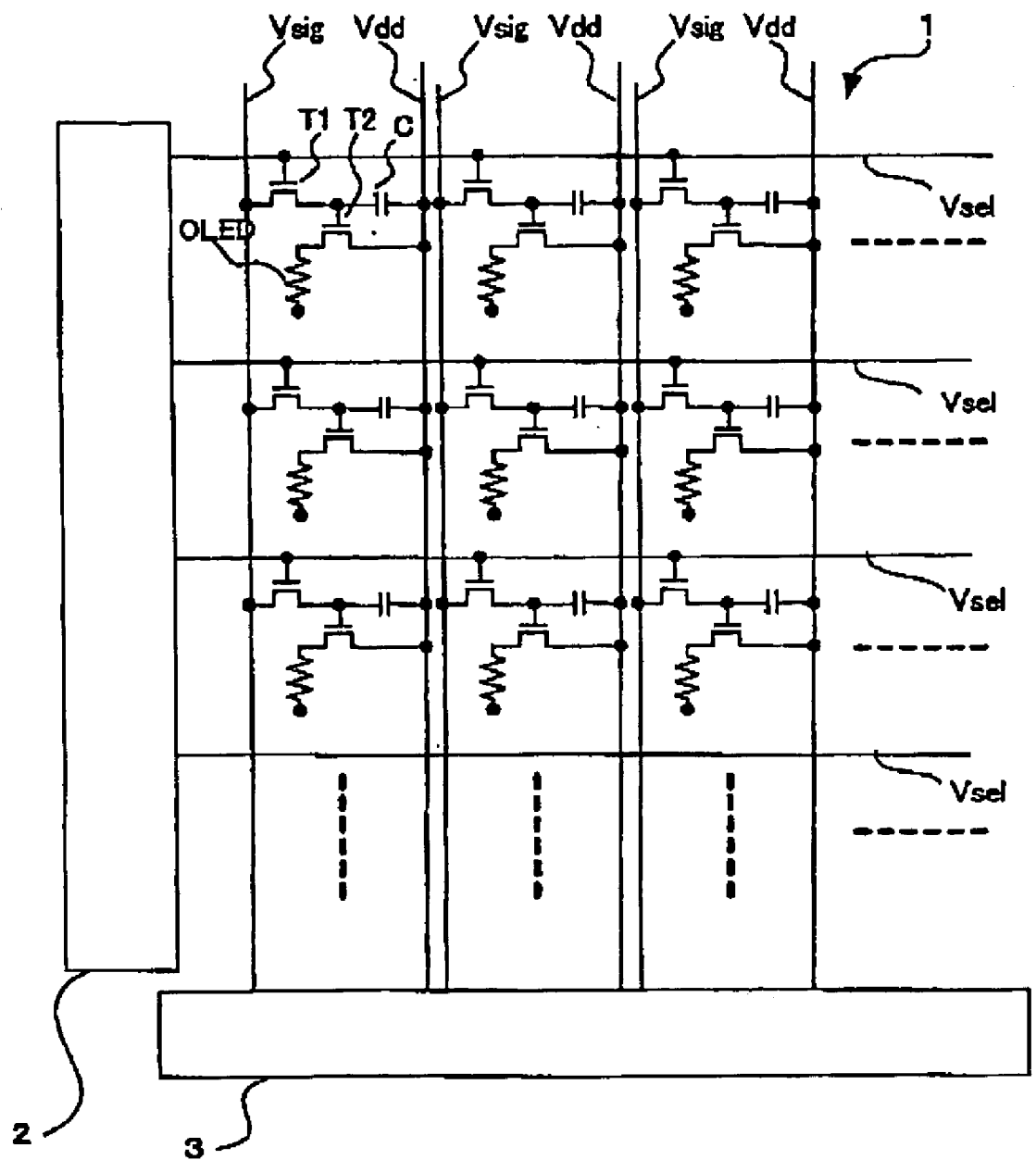
FIG. 5 is a connection diagram illustrating the display according to Embodiment 3.

FIG. 5 is a connection diagram of a display 1 of this embodiment. The display device according to this embodiment includes, in its pixel regions, a light emitting layer OLED that is capable of emitting light through the electroluminescense effect, and a retention capacitor C for storing the current for driving such OLED; and a semiconductor device that is prepared by the manufacturing method of the present invention (thin-film transistors T1 and T2 in the embodiments). From the driver region 2, selection signal lines Vsel are supplied to the respective pixel regions. From the driver region 3, signal lines Vsig and power supply lines Vdd are supplied to the respective pixel regions. By controlling the selection signal lines Vsel and the signal lines Vsig, a program pertaining to the currents for the respective pixel regions is implemented, and light emisison by the OLED in the light emitting section is controlled.

The above drive circuit is merely an example of a circuit that can be used when an electroluminescense device is used as a light emitting element, and other circuit structures can also be used. Furthermore, by changing the circuit structures, liquid crystal displays can also be used as a light emitting element.

A display 1 according to this embodiment can be applied to various electronic devices. FIG. 6 shows examples of electronic devices to which the display panel 1 can be applied.

Figure 6A:
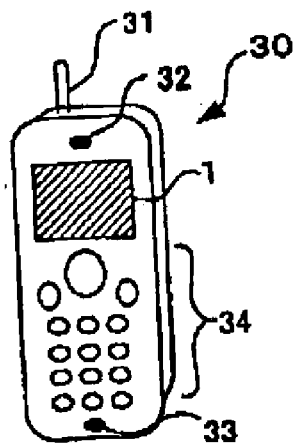
FIG. 6 is an example of the electronic device according to Embodiment 3. The reference numerals respectively show: 6A a portable phone; 6B a video camera; 6C a portable personal computer; 6D a head mount display; 6E a rear type projector; and 6F an example of how to apply the display panel according to the present invention to a front type projector.

FIG. 6A shows one example of how to apply the display panel 1 to a portable phone. A portable phone 30 has an antenna section 31, a voice outputting section 32, a voice inputting section 33, an operating section 34 and the display panel 1 of the present invention. The display device of the present invention can thus be used as a displaying section.

Figure 6B:
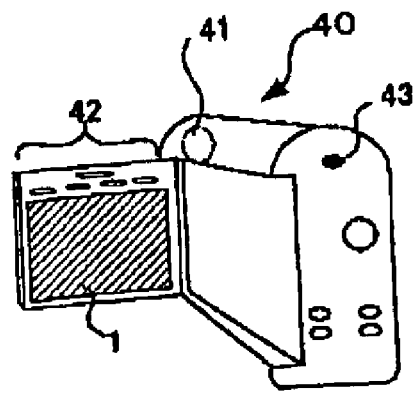

FIG. 6B shows one example of how to apply the display panel 1 to a video camera. A video camera 40 has an image receiving section 41, an operating section 42, a voice inputting section 43 and the display device 1 of the present invention. The display device of the present invention can thus be used as a finder or a displaying section.

Figure 6C:
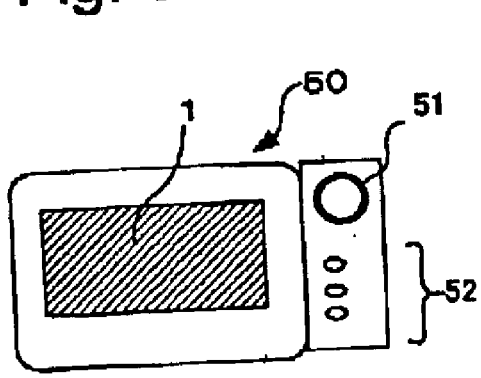

FIG. 6C shows one example of how to apply the display panel 1 to a portable personal computer. A computer 50 has a camera section 51, an operating section 52 and the display device 1 of the present invention. The display device of the present invention can thus be used as a displaying section.

Figure 6D:
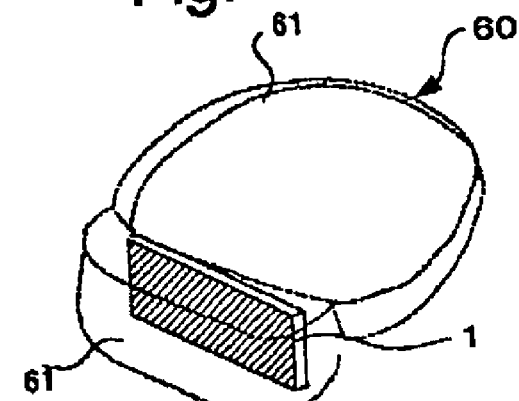

FIG. 6D shows one example of how to apply the display panel 1 to a head mount display. A head mount display 60 has a band 61, an optical system housing section 62 and the display device 1 of the present invention. The display device of the present invention can thus be used as an image displaying source.

Figure 6E:
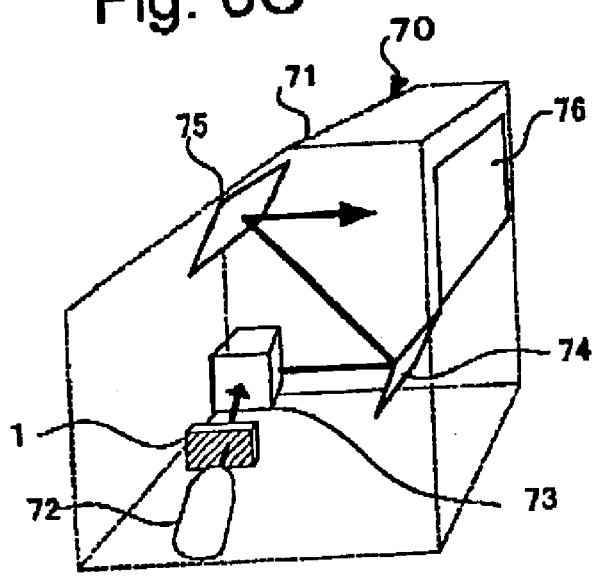

FIG. 6E shows one example of how to apply the display panel 1 to a projector. A projector 70 has a casing 71 that includes a light source 72, a composite optical system 73, mirrors 74 and 75, a screen 76 and the display device 1 of the present invention. The display device of the present invention can thus be used as an image displaying source.

Figure 6F:
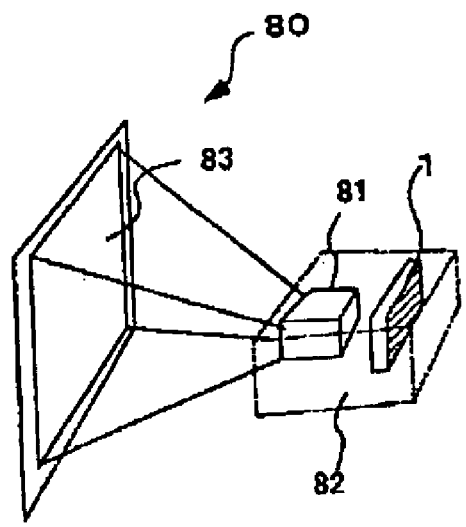

FIG. 6F shows one example of how to apply the display panel 1 to a front type projector. A projector 80 has a casing 82 that includes an optical system 81 and the display device 1 of the present invention. Images can be displayed on a screen 83. The display device of the present invention can thus be used as an image displaying source.

In addition to the examples mentioned above, the display device 1 of the present invention can be applied to any electronic device to which an active matrix display device can be applied. Furthermore, the display device 1 can be used, for example, in facsimile devices having displaying functions, digital camera finders, portable TVs, DSP devices, PDAs, electronic notebooks, electronic signboards, and advertisement and announcement displays.

Advantage of the Invention

As explained above, according to the method of the present invention, an aperture is provided on the surface of an insulating film, and an amorphous silicon film that is formed on the aperture is changed to a polycrystalline silicon film by the solid-phase growth through heat treatment, and such silicon film is irradiated by a laser beam, so that the polycrystalline silicon in the aperture is maintained in an unmelted state, while other parts of the polycrystalline silicon film are melted, and crystal is formed using the unmelted polycrystalline silicon in the aperture as a crystal nucleus, and a silicon film in a substantially single crystal state is formed in an area around the aperture formed on the surface of the polycrystalline silicon film. Thus, there is no need to form a precise aperture and no expensive and precise exposure device nor etching device is necessary to form the aperture. Consequently, a number of high performance thin-film transistors can be easily formed on a large glass substrate, such as a large liquid crystal display.

Therefore, the present invention provides a semiconductor device with a particularly high performance. For example, by having a thin-film transistor as a semiconductor device, a transistor with a particularly high performance, namely, a small off-state current value, sharp subliminal properties and high mobility, is provided.

What is claimed is:

1. A method for manufacturing a semiconductor device, comprising the steps of:
   forming an insulating film on a substrate;
   forming an aperture extending substantially perpendicular to a surface of the insulating film at a prescribed position on the surface of the insulating film;
   forming an amorphous silicon film on the insulating film with a prescribed thickness;
   changing the amorphous silicon film into a polycrystalline silicon film by controlling solid-phase growth through a heat treatment such that the aperture, in the diameter direction of the aperture, contains only a single grain of polycrystalline;
   irradiating the polycrystalline silicon film by a laser beam under a prescribed condition, and maintaining the polycrystalline silicon inside the aperture in an unmelted state, while melting other parts of the polycrystalline silicon film, and generating crystal growth using the unmelted polycrystalline silicon inside the aperture as a crystal nucleus, and forming a silicon film in a substantially single crystal state in an area around the aperture in the polycrystalline silicon film; and
   producing a semiconductor device having the silicon film in the substantially single crystal state as a semiconductor film.

2. The method for manufacturing a semiconductor device according to claim 1, wherein the semiconductor device having the semiconductor film in an area of the silicon film in the substantially single crystal state, not including the aperture, is formed.

3. The method for manufacturing a semiconductor device according to claim 1, wherein the cross section of the aperture has the same or a smaller grain diameter in comparison to a grain diameter of a polycrystal generated by the solid-phase growth through the heat treatment.

4. The method for manufacturing a semiconductor device according to claim 1, wherein the insulating film has a multilayered structure including a silicon dioxide film and a silicon nitride film, and within the multilayered structure, the silicon dioxide film is provided on the side of the amorphous silicon film.

5. The method for manufacturing a semiconductor device according to claim 1, wherein the semiconductor device has a thin-film transistor structure, and the aperture is provided corresponding to a position to form the thin-film transistor.

6. A semiconductor device comprising a substrate; an insulating film formed on said substrate; and a semiconductor film formed on said insulating film; wherein and
   said insulating film has an aperture formed in a prescribed position,
   and wherein said semiconductor film includes a silicon film in a substantially single crystal state created by crystal growth, using a crystallized silicon film inside said aperture in said insulating film as a crystal nucleus, said grain of polycrystalline silicon being generated by a solid-phase growth through a heat treatment, and
   said aperture has a diameter the same as or similar to a grain diameter of polycrystalline generated by the solid-phase growth through the heat treatment.

7. The semiconductor device according to claim 6, wherein said semiconductor film is a semiconductor film in an area of said silicon film in the substantially single crystal state, not including said aperture.

8. The semiconductor device according to claim 6, wherein said insulating film has a multilayered structure including a silicon dioxide film and a silicon nitride film, and within said multilayered structure of the insulating film, said silicon dioxide film is formed on the side of said silicon film in the substantially single crystal state.

9. A display device comprising the semiconductor device of claim 6 as a thin-film transistor.

10. An electronic device comprising a display device having the semiconductor device of claim 6 as a thin-film transistor.

* * * * *